United States Patent [19]

van Vloten

[11] 4,058,699
[45] Nov. 15, 1977

[54] RADIANT ZONE HEATING APPARATUS AND METHOD

[75] Inventor: Curtis P. van Vloten, Somerville, Mass.

[73] Assignee: Arthur D. Little, Inc., Cambridge, Mass.

[21] Appl. No.: 601,157

[22] Filed: Aug. 1, 1975

[51] Int. Cl.² .................. B23K 28/00; F21V 7/00; B01J 17/08; G02B 5/10
[52] U.S. Cl. .................. 219/121 LM; 23/273 SP; 156/620; 219/121 L; 219/349; 264/25; 350/299; 362/346
[58] Field of Search .... 219/121 L, 121 LM, 347–349, 219/354, 405, 411, 377, 23–273 SP; 350/6, 285, 299, 288, 290, 292–294, 296; 240/41.35 C, 41.35 D; 126/270, 271; 156/620, DIG. 80; 331/DIG. 1; 128/303.1, 362, 395–399; 264/25, 64, 165, 176 R, 176 F

[56] References Cited

U.S. PATENT DOCUMENTS

| | | | |
|---|---|---|---|
| 1,278,026 | 9/1918 | Salto | 219/349 X |
| 2,543,053 | 2/1951 | Parker | 219/349 X |
| 3,015,013 | 12/1961 | Laszlo | 219/349 X |
| 3,453,425 | 7/1969 | Whitaker | 219/349 X |
| 3,603,766 | 9/1971 | Kino et al. | 219/349 |
| 3,798,441 | 3/1974 | Wilson | 240/41.35 C |
| 3,802,767 | 4/1974 | Rambauske | 350/294 |
| 3,805,019 | 4/1974 | Gorishek | 219/349 |
| 3,817,710 | 6/1974 | Mizutani et al. | 219/349 X |
| 3,820,903 | 6/1974 | Kimdl et al. | 331/DIG. 1 |
| 3,827,059 | 7/1974 | Rambauske | 350/294 |
| 3,865,564 | 2/1975 | Jaeger et al. | 219/121 L X |
| 3,871,751 | 3/1975 | Pambauske et al. | 350/293 |
| 3,893,754 | 7/1975 | McInally | 350/294 |
| 3,943,324 | 3/1976 | Haggerty | 156/620 |
| 3,944,640 | 3/1976 | Haggerty et al. | 264/25 |

FOREIGN PATENT DOCUMENTS

| | | | |
|---|---|---|---|
| 291,441 | 5/1929 | United Kingdom | 219/349 |

Primary Examiner—A. Bartis
Attorney, Agent, or Firm—Bessie A. Lepper

[57] ABSTRACT

A heating zone of accurately controlled length and predetermined energy profile throughout its length is formed within a focusing apparatus. An elliptical cavity is provided having a conically-configured reflector positioned such that its longitudinal axis coincides with one of the focal axes of the elliptical cavity. An elongate body is placed within the cavity such that its longitudinal axis coincides with the other focal axis. When a beam of radiant energy within a wavelength range which couples with the body to heat it, e.g., a laser beam, is directed onto the conically-configured reflector it is concentrated uniformly around the body throughout a predetermined length. The energy profile along the zone length may be varied either by adjusting the energy distribution in the energy beam prior to being reflected, by modifying the surface contour of the reflector, by modifying the contour of the walls defining the elliptical cavity or by a combination of two or more of these techniques. A plurality of overlapping elliptical cavities may be arranged to have one common axes along which the reflector is positioned and a plurality of axes along which a plurality of elongate bodies are positioned. The apparatus of this invention is particularly suited for heating rods and tubes and, if desired, for use within a controlled atmosphere.

36 Claims, 10 Drawing Figures

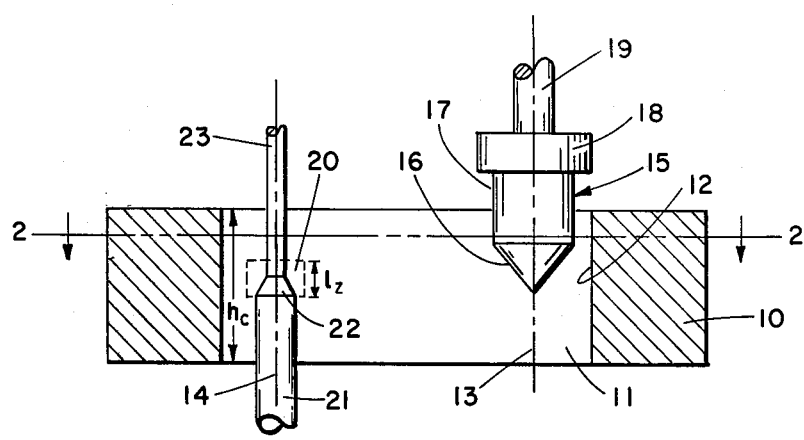
Fig. 1
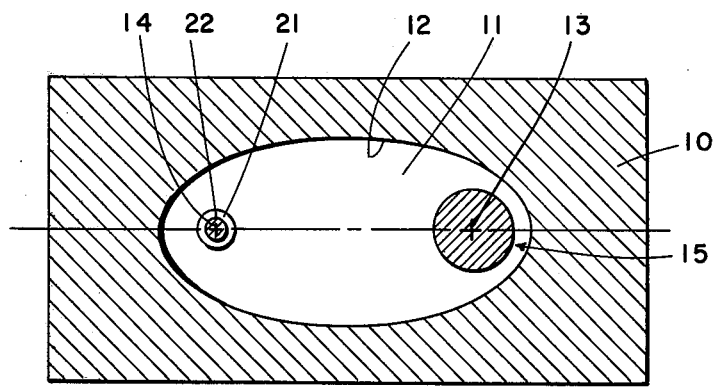
Fig. 2
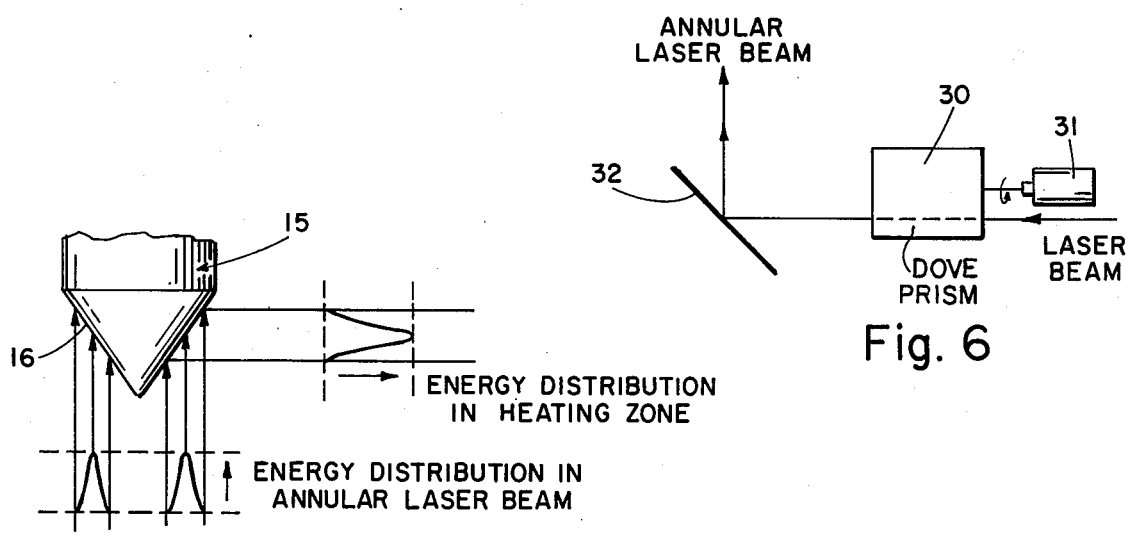
Fig. 5
Fig. 6

RADIANT ZONE HEATING APPARATUS AND METHOD

This invention relates to apparatus for focusing a beam of radiant energy around the surface of a body and within a relatively narrow band length to concentrate the energy in a heating zone with controlled energy distribution. The radiation is derived from that portion of the electromagnetic spectrum which will couple with the body to be heated in the zone. Exemplary of such energy is a beam from a laser.

The use of radiant energy, and particularly laser energy, to provide a concentrated heating zone for such processes as zone refining and forming refractory fibers and tubings by the processes described in U.S. Pat. application Ser. Nos. 369,884, now U.S. Pat. No. 3,944,640 and 318,911, now U.S. Pat. No. 3,943,324 assigned to the same assignee as this application, has certain distinct advantages. Thus, for example, laser energy has no characteristic temperature of its own and therefore there are virtually no upper limitations on the temperatures which can be attained in a heating zone. Laser energy can be employed in a manner to eliminate or minimize problems of heat transfer to the body within the heating zone. Moreover, the use of laser energy imposes few, if any, restrictions on the atmosphere in which the heating is performed and it thereby provides a wide latitude in the choice of such atmospheres. Finally, the use of laser energy permits visual observation of a process employing it.

All of these important advantages associated with laser energy make its use highly desirable. There is, however, the problem of optically focusing such radiant energy, generally originating as a single beam, around the entire surface of a rod, fiber or tube to attain uniform peripheral heating. In zone melting, such uniform heating is desirable, while in forming fibers or tubes by the methods of U.S. Pat. Nos. 3,944,640 and 3,943,324, such uniform peripheral heating is essential.

There are, of course, a number of different arrangements of optical elements which can be used to achieve the desired focusing of a beam of radiant energy in general, and a laser beam in particular, to attain peripheral heating which approaches the desired degree of uniformity. Generally, however, such optical systems are formed of a large number of optical elements which require considerable skill to assemble on an optical bench and to adjust to a high degree of accuracy. Moreover, if any high degree of control is to be attained over the distribution of the energy along the height of the band, additional optical elements may be called for.

It will be apparent that there is a need for a simple, highly accurate method and apparatus for focusing a beam of radiant energy, around the surface of a body and within a relatively narrow band length, method and apparatus which are desirable in zone melting; and which are essential in fiber formation in a process where the fiber is pulled from a melt zone supported by a feed rod such as is described in U.S. Pat. No. 3,944,640 and in tubing formation in a process where preformed tubing blanks are heated to advance a molten ring through the tubing to form a tubing approaching theoretical density and being of a single crystal if desired such as is described in U.S. Pat. No. 3,943,324.

It is therefore a primary object of this invention to provide an apparatus for focusing a beam of laser energy, or other types of radiant energy (all of which are hereinafter referred to as radiation beams), around the entire surface of an elongated body, such as a rod, fiber or tubing, within a relatively narrow length. It is another object of this invention to provide apparatus of the character described which achieves substantially uniform energy distribution with respect to the peripheral surface of the body at any one plane or band along its length and controlled, predeterminable energy distribution along or throughout its length. Yet another object of this invention is to provide such an apparatus which is relatively simple to construct and which lends itself to ready incorporation into apparatus for forming fibers and tubings and for zone melting.

It is another primary object of this invention to provide an improved method of focusing a radiation beam, and particularly a laser beam, around the entire surface of an elongate body to produce around said body a heating zone of accurately controlled length and exhibiting therealong a predetermined profile of energy distribution for a number of different processes including fiber and tubing formation, preheating, postheating, and the like. Another object of this invention is to provide a method of the character described which provides the heating zone necessary to pull refractory fibers from a stable molten pool of a refractory material supported through surface tension forces on a refractory feed rod or to form refractory tubings by advancing a molten ring therealong.

Other objects of the invention will in part be obvious and will in part be apparent hereinafter.

According to one aspect of this invention there is provided an apparatus for focusing a radiation beam, particularly a laser beam, around the surface of a body to form a heating zone defined within a relatively narrow length which comprises means defining an elliptical cavity of a predetermined height and having two spaced-apart focal axes extending therethrough and conically-configured reflecting means within the cavity positioned such that the axis of the conically-configured reflecting means coincides with one of the focal axes of the elliptical cavity. The radiation beam from a suitable source is directed onto the surface of the conically-configured reflecting means which in turn concentrates, through reflection by the wall of the elliptical cavity, the radiant energy at the other focal axes to form the desired heating zone in which the body to be heated is placed such that its axis coincides with the other focal axis of the elliptical cavity. The energy distribution within the heating zone at any given level is substantially uniform around the surface of the body, and by controlling and/or adjusting the energy distribution within the incident beam of radiant energy, the contour of the conically-configured reflecting means and/or the internal wall of the elliptical cavity, the energy distribution along the length of the heating zone may be adjusted and controlled. In a modification of this aspect of the invention, a plurality of elliptical cavities may be used which have one focal axis in common along which the conically-configured reflecting means is located and in which bodies to be heated are positioned along the other separate focal axes.

According to another aspect of this invention, an apparatus is provided which is particularly suited for forming fibers according to the method described in U.S. Pat. No. 3,944,640. By this method a fiber is drawn from a stable melt volume of a material supported principally through surface tension forces on a feed rod of the material positioned within a heating zone. This method allows extremely pure fibers to be formed inasmuch as there is no possibility of contamination from a crucible and permits forming fibers of refractories for which no suitable crucible material is known.

In another aspect, this invention provides apparatus which is particularly suited for forming refractory tubings according to the method described in U.S. Pat. No. 3,943,324. By this method, refractory tubings, either in polycrystalline or single crystal form, are made by moving a preformed tubing of a refractory material through a heated zone which provides sufficient heat to melt through the tubing to form a molten ring which is continuously advanced through the tubing.

The apparatus of this invention for forming fibers or tubings comprises the focusing element of this invention, and separate means to impart translational, and if desired rotational, motion to the feed rod and fiber formed or to the solid sections on either side of the molten ring in tubings. Optionally, the apparatus may also include means to adjust the length of the heating zone and the energy distribution along the zone length, means to effect adjustments in the beam of radiant energy and means to control the atmosphere around and within the heating zone.

In yet another aspect of this invention there is provided a method for forming a heating zone of laser energy, or other forms of radiant energy, around the surface of a body, e.g., a fiber, tube or rod, the heating zone being of a relatively narrow but accurately controllable length. This method comprises providing an elliptical cavity of a predetermined height and having two spaced-apart focal axes; positioning a conically-configured reflector within the elliptical cavity so that the axis of the reflector coincides with one of the focal axes of the elliptical cavity; directing a radiation beam onto the conically-configured reflector which directs the radiant energy onto the walls of the elliptical cavity which in turn concentrates the energy along the other axis of the elliptical cavity to form a heating zone; and positioning the body which is to be heated within the zone such that its axis coincides with the other of the focal axes of the elliptical cavity. The body to be heated is moved along its axis and, if desired, it is rotated. The beam of coherent radiant energy may be used in a form in which it exhibits a gaussian distribution or any other suitable energy distribution.

Although these aspects of the invention will, for convenience, be described in terms of forming fibers by the method of U.S. Pat. No. 3,944,640, it is, of course, also within the scope of this invention to employ it in zone melting and to the formation of refractory tubing according to the U.S. Pat. No. 3,943,324 assigned to the same assignee, as well as in any other processes requiring the use of a well-defined heating zone.

The invention accordingly comprises the several steps and the relation of one or more such steps with respet to each of the others, and the apparatus embodying features of construction, combinations of elements and arrangement of parts which are adapted to effect such steps, all as exemplified in the following detailed disclosure, and the scope of the invention will be indicated in the claims.

For a fuller understanding of the nature and objects of the invention, reference should be had to the following detailed description taken in connection with the accompanying drawings in which FIG. 1 is a longitudinal cross section of the focusing apparatus of this invention showing one embodiment of the conically-configured reflector;

FIG. 2 is a cross section of the focusing apparatus of FIG. 1 taken through plane 2—2 of FIG. 1;

FIG. 5 illustrates diagrammatically the use of an annular laser beam in the focusing apparatus of this invention and the resulting energy profile within the heating zone developed;

FIG. 6 shows diagrammatically one means for creating an annular laser beam;

Figure 10:
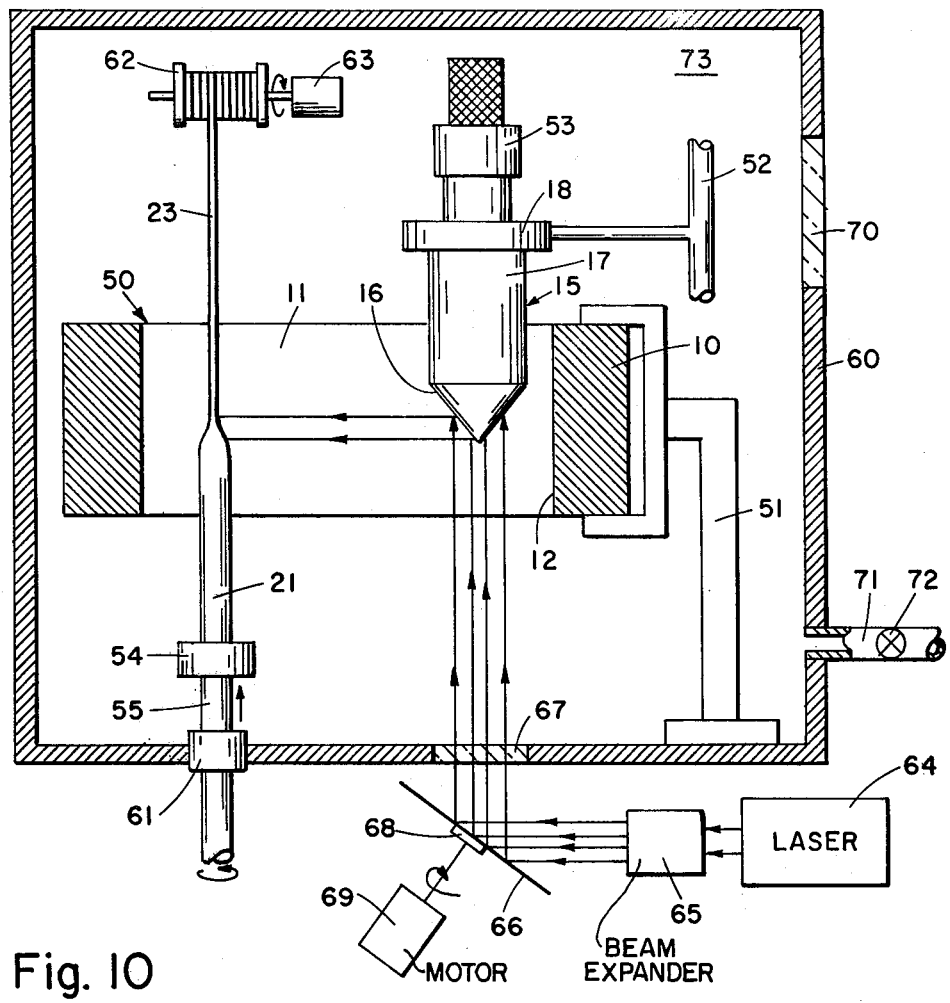
Figure 9:
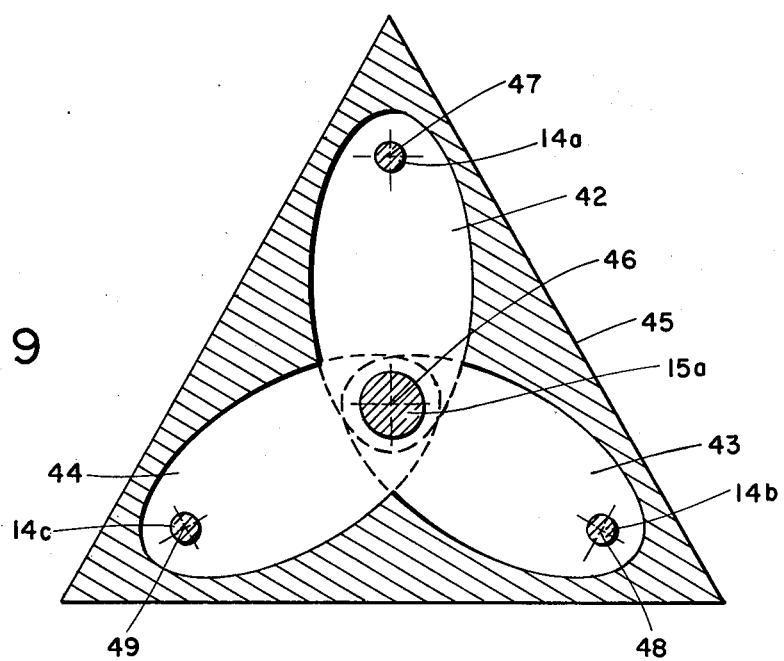

FIG. 9 is a cross section of apparatus constructed in accordance with this invention incorporating a plurality of elliptical cavities having one common focal axis along which the reflecting means is placed and a plurality of separate axes along which bodies to be heated are placed; and FIG. 10 illustrates, in somewhat simplified fashion, a complete system for forming fibers using the focusing apparatus of this invention.

For convenience in describing the method and apparatus of this invention it will be assumed that the radiant energy is derived from a laser. However, this method and apparatus are equally suitable for the focusing of other forms of radiation beams such as those derived from incandescent, arc and discharge lamp sources, and the like.

FIGS. 1 and 2 illustrate the focusing apparatus of this invention in cross sectional detail. This apparatus comprises a block 10, formed of such materials as a plastic, aluminum, brass, bronze or the like, having an elliptical cavity 11 cut therethrough. The wall 12 of cavity 11 may be coated such as by plating with gold to render it highly reflective to radiant energy. Elliptical cavity 11 has two focii which, since they have height, may be referred to as focal axes, designated by the reference numerals 13 and 14.

Positioned within elliptical cavity 11 is a conically-configured reflector 15 which is so located that its axis coincides with the first optical axis 13. In FIG. 1, conically-configured reflector 15 is shown to comprise a true cone reflecting surface 16 and a cylindrical base 17, the latter being held firmly by any suitable means such as a chuck 18 supported by a load bearing rod member 19. As will be described below in connection with FIG. 4, the position of the conically-configured reflector within the elliptical cavity determines the location of the heating zone 20 within the cavity. The height of the cavity, $h_c$, must be greater than the length of the heating zone, $l_z$, so that the heating zone is defined entirely within the elliptical cavity.

The body to be heated within heating zone 20 is positioned such that its axis coincides with the second optical axis 14 of the elliptical cavity. In FIGS. 1 and 2, this body is shown to be a combination of a feed rod 21, a stable melt volume 22, and a solid fiber 23 which has been pulled from melt volume 22. As noted above, this method for forming fibers, from refractory material such as $Al_2O_3$ as well as from such amorphous materials as glass, is described in detail in U.S. Pat. No. 3,944,640. In that method it is necessary to provide a relatively sharply defined heating zone within which the material of the feed rod is melted to form a stable melt from which to pull the fibers.

Figure 3:
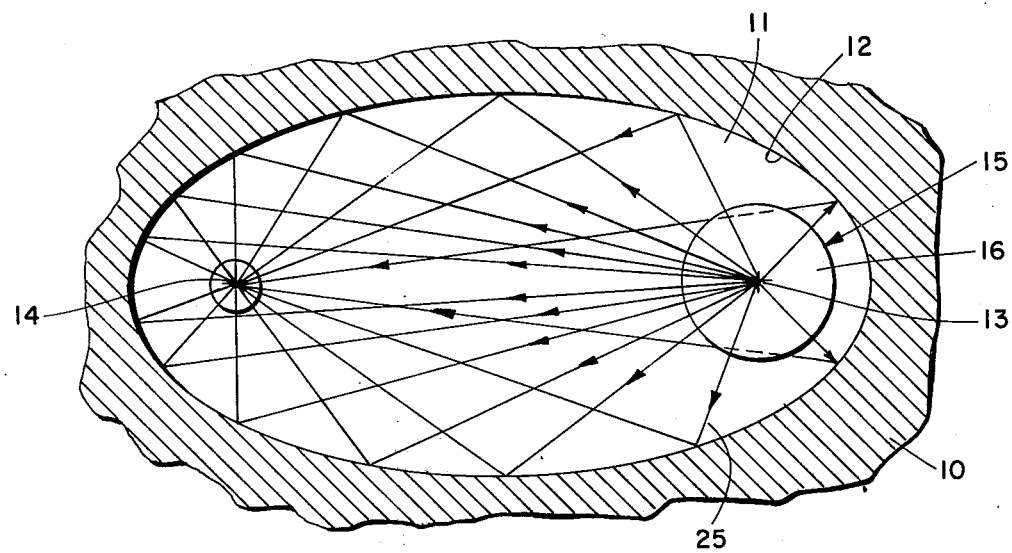
FIG. 3 illustrates diagrammatically the manner in which the focusing apparatus of this invention functions.
Figure 4:
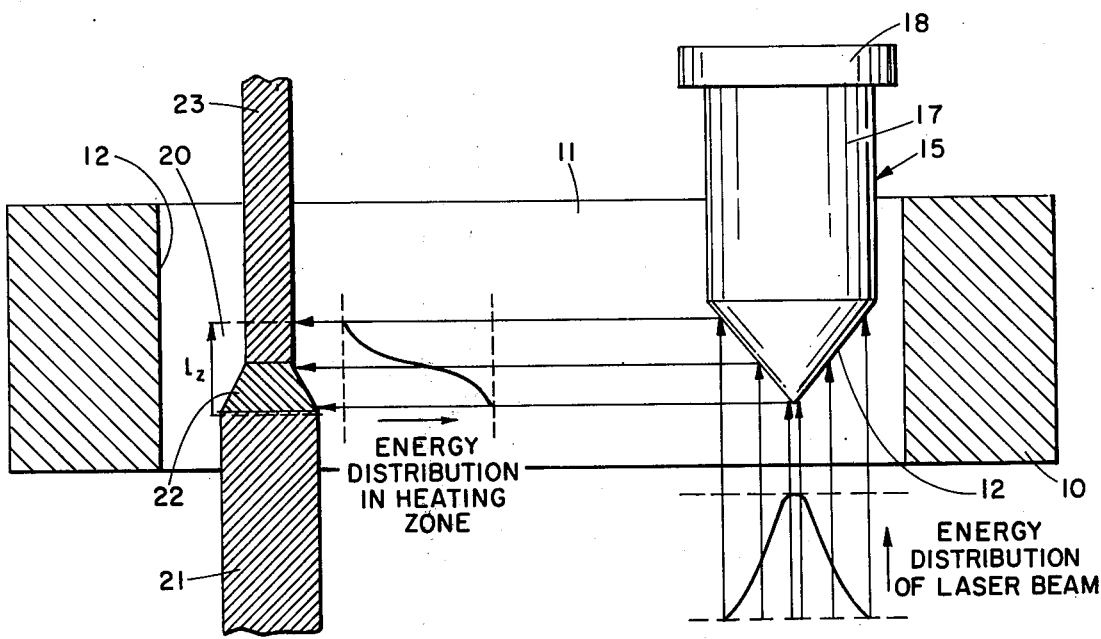
FIG. 4 illustrates diagrammatically how the radiant energy of a laser beam is focused by one embodiment of the focusing apparatus of this invention.

The optics of the focusing apparatus of this invention are illustrated diagrammatically in FIGS. 3 and 4. In FIG. 3, the selected beams such as 25 are used to represent the radiant energy from the laser being reflected off cone surface 16 and being concentrated at the second focal axis 14. It is apparent from FIG. 3 that by placing the body to be heated such that its axis coincides with focal axis 14, it is located in a heating zone and is substantially uniformly heated around its entire surface at any given length level within the heating zone. It is desirable in choosing the configuration of the elliptical cavity to optimize the diameters of the cone and feed rods in relation to the major and minor diameters of the ellipse to minimize shadowed areas. As discussed below, rotation of the feed rod may be used also for the same purpose.

An important feature of the focusing apparatus of this invention lies in the ability to predetermine, adjust and control the energy profile throughout the length of the heating zone. This may be accomplished in one or more ways including adjusting the energy distribution within the laser beam itself, modifying the surface contour of the conically-configured reflector, modifying the contour of the wall defining the elliptical cavity, or a combination of two or more of these techniques. Exemplary means and methods of achieving this adjustment and control of the energy profile in the heating zone are illustrated in FIGS. 4–8 in which the same reference numerals are used to identify the same elements as described in conjunction with the discussion of FIGS. 1–4.

In the embodiment illustrated in FIG. 4 the laser beam striking conical reflecting surface 16 is essentially unmodified except for expansion in any well-known beam expanding device. It therefore exhibits a Gaussian energy distribution as shown by the curve plotted in FIG. 4. A laser beam with this type of energy distribution incident upon a reflector having a true conical reflecting surface gives rise to a heating zone having the energy profile plotted in FIG. 4 adjacent to the heating zone 20. Thus it will be seen that maximum energy (hence maximum heating) is delivered within that area of the heating zone in which melt volume 22 is formed. Although it is possible to limit the length of the heating zone to coincide with the height of the melt volume 22, this may not always be desirable. Thus in FIG. 4, the heating zone extends above the melt volume and exhibits a sharply decreasing intensity. Within this portion of the heating zone the fiber 23 is solidified; but subjected to heating for annealing.

In some instances it may be desirable to develop a heating zone in which by far the greater amount of energy is concentrated within a very narrow portion of the total zone length. One way of achieving this is illustrated in FIGS. 5 and 6. By focusing the laser beam to have an annular cross section prior to directing it onto the conically-configured reflector, one may obtain an energy profile in the heating zone as shown in FIG. 5. An energy profile such as that shown in FIG. 5 provides the possibility of preheating a feed rod and postheating the fiber formed. There are, of course, several suitable devices for forming the laser beam into the desired annular beam configuration and one exemplary one is illustrated diagrammatically in FIG. 6. In this scheme, a laser beam, preferably subsequent to expansion, is passed through a Dove prism 30 which is rotated by a motor 31 and then directed by mirror 32 onto conical surface 16.

Figure 7:
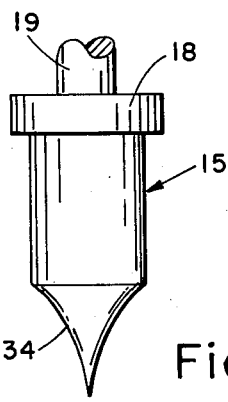
FIG. 7 illustrates another embodiment of the conically configured reflector and its ability to change the energy profile within the heating zone developed within the focusing apparatus.

FIG. 7 illustrates a modified conically-configured reflector in which the reflecting surface 34 is concave. Depending upon the energy distribution within the incident laser beam, it is possible with the conically-configured reflector of FIG. 7 to concentrate the laser energy within the heating zone or to distribute it relatively uniformly throughout the height of the zone.

Figure 8:
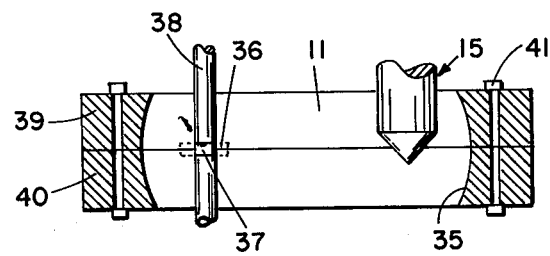
FIG. 8 illustrates a modification of the contour of the wall forming the elliptical cavity and the manner in which it changes the energy profile within the heating zone.

FIG. 8 illustrates a modification in the configuration of the wall defining the elliptical cavity 11. This wall 35 has a concave shape and achieves a concentration of the energy to form a narrow heating zone 36 giving rise to a narrow molten zone 37 in a rod 38. Such a narrow molten zone may be desired in some materials wherein the forces of surface tension are relatively low. For ease of construction, the elliptical cavity of the apparatus of FIG. 8 is preferably formed in two complementary blocks 39 and 40 held together by a plurality of bolts 41.

It is, of course, within the scope of this invention to use additional optical means to vary the characteristics of the incident laser beam as well as to use other configurations of the reflecting surfaces (conically-configured reflector and elliptical cavity wall). It is also, of course, possible to locate any suitable focusing optical element or elements upstream from the ellipse and reflecting surface to attain the desired distribution of energy within the heating zone. This modification is illustrated in FIG. 10 and described below.

It is also within the scope of this invention to form the focusing apparatus as a plurality of elliptical cavities having one common focal axis and a plurality of separate focal axes. Such as apparatus is illustrated in FIG. 9, showing, as an example, the use of three overlapping elliptical cavities 42, 43 and 44 formed in a block 45. The overlapping of the elliptical cavities is such as to provide them with one common focal axis 46 and three separate axis 47, 48 and 49. It will be apparent that a single conically-configured reflecting surface 15a, positioned so that its axis coincides with common focal axis 46 will be in a position to reflect radiation and hence create separate heating zones around bodies 14a, 14b and 14c placed so that their axes coincide with axes 47, 48 and 49. A portion of the radiation thus directed will, of course, be lost to each of these bodies, but if they are of the character which can tolerate such heat losses, and particularly if they are rotated, it is possible to create a plurality of effective heating zones in this manner using a single reflecting means and associated optical system. Any of the previously described means for controlling the energy distribution within the heating zone may also, of course, be used when using the apparatus modification illustrated in FIG. 9; and it is within the scope of this invention to use two or more elliptical cavities in conjunction with a single reflecting means.

FIG. 10 illustrates a total system for forming fibers by the method described in application U.S. Pat. No. 3,944,640 incorporating the focusing apparatus of this invention. The focusing apparatus, generally indicated by reference numeral 50, is supported by a support system 51. The conically-configured reflector 15 is likewise held in position by a support 52 which may, if desired, be equipped with means, such as micrometer 53, for making fine vertical adjustments. The feed rod 21 is held in a chuck 54 which in turn is supported by a suitable load-bearing rod 55 to which translational motion is imparted by any suitable device such as that described in U.S. Pat. No. 3,552,931. If desired, load-bearing rod 55 may also be rotated. Fiber 23, which may be held by a chuck on a load-bearing rod, is in FIG. 10 shown to be wound on to a spool 63 which is turned by motor 63. Thus the translational motion of the fiber is attained.

If the fiber 23 is to be formed within a controlled atmosphere, e.g., within a reducing atmosphere or under gas pressure, that part of the system in which the fiber is formed may be located within a suitable housing means shown somewhat diagrammatically as housing 60. Apparatus such as that shown in U.S. Pat. No. 3,552,931 in which a bearing seal 61 is provided for load-bearing rod 55 may be employed so that the means used to impart translational and rotational motion to rod 55 may be located external of housing 60. FIG. 10 illustrates the use of a spool 62 rotated by motor 63 to effect the required translational motion of fiber 23 as it is formed. It is also, of course, possible to move fiber 23 by attaching it to another load-bearing rod.

Laser 64 provides the required radiant energy; and the beam from laser 64 may be expanded in beam expander 65 constructed in any one of a number of known ways. The resulting expanded laser beam is directed by mirror 66 onto conically-configured reflector 15, passing through window 67 of housing 60, if the fiber forming process is carried out within such an enclosure. If desired, mirror 66 may be affixed to a support 68 which in turn may be rotated by motor 69. If support 68 is so designed to position and hold mirror 66 slightly off line from the axis of the motor shaft, then the rotation of mirror 66 will impart a small degree of "wobble" to it. This in turn will result in ensuring a high degree of uniformity of intensity of the laser beam striking conical surface 16 and of the heating zone thus created. Alternatively, 66 may be an optical element, such as a focusing mirror, capable of effecting the convergence of the radiation beam and hence of controlling the energy distribution within the heating zone. Thus such a focusing mirror provides means for accomplishing this upstream from the elliptical cavity and reflecting means. Finally, housing 60 is seen to have a viewing port 70, and a fluid line 71, with valve 72, for introducing fluid into or withdrawing fluid from the chamber 73 defined within housing 60.

Through the use of the focusing method and apparatus of this invention it is possible to provide a uniform zone of heating within accurately defined limits. Moreover, it is possible to achieve any desired energy profile throughout the length of the zone. The method and apparatus are particularly well suited for developing accurately controlled melt volumes of materials having relatively high melting points, for forming tubes by the process described in U.S. Pat. No. 3,943,334, and for forming refractory fibers by pulling them from a stable melt volume supported on the top of a feed rod, the melt volume being formed as the fiber is drawn.

It will thus be seen that the objects set forth above, among those made apparent from the preceding description, are efficiently attained and, since certain changes may be made in carrying out the above method and in the constructions set forth without departing from the scope of the invention, it is intended that all matter contained in the above description or shown in the accompanying drawings shall be interpreted as illustrative and not in a limiting sense.

I claim:

1. An apparatus for focusing a radiation beam around the surface of at least one body within a relatively narrow band height, comprising in combination
   a. means defining an elliptical cavity of predetermined height, said cavity having a first focal axis and a separate second focal axis extending therethrough, the wall of said cavity being optically reflective;
   b. conically-configured reflecting means positioned within said elliptical cavity such that the longitudinal axis of said conically-configured reflecting means coincides with said first focal axis of said elliptical cavity whereby radiation from a source of coherent radiant energy can be directed longitudinally toward said conically-configured surface so as to strike the surface of said conically-configured reflecting means to be directed against said wall of said elliptical cavity and to be thereby reflected to form a heating zone of controlled length and of substantially uniform energy distribution at any one level along said length of said heating zone around said second focal axis of said elliptical cavity.

2. An apparatus in accordance with claim 1 having a plurality of said elliptical cavities, said cavities being overlapped so as to have a common first focal axis and separate second focal axes whereby a plurality of separate heating zones are formed simultaneously.

3. An apparatus in accordance with claim 1 including means associated with either said elliptical cavity, said conically-configured reflecting means or with both said elliptical cavity and said reflecting means to adjust the energy profile throughout the length of said heating zone.

4. An apparatus for focusing a radiation beam around the surface of a body within a relatively narrow band length, comprising in combination
   a. means defining an elliptical cavity of a predetermined height and having first and second focal axes extending therethrough, the wall of said cavity being optically reflective;
   b. conically-configured reflecting means positioned within said elliptical cavity such that the longitudinal axis of said conically-configured reflecting means coincides with said first focal axis of said elliptical cavity whereby a radiation beam from a source of radiant energy can be directed longitudinally toward said conically-configured surface so as to strike the surface of said conically-configured reflecting means to be directed against said wall of said elliptical cavity and to be thereby reflected to form a heating zone of controlled length and of substantially uniform energy distribution at any one level along said length of said heating zone around said second focal axis of said elliptical cavity.

5. An apparatus in accordance with claim 4 wherein said conically-configured reflecting means is configured to have a truly conical surface.

6. An apparatus in accordance with claim 4 including means associated with either said elliptical cavity, said conically-configured reflecting means or with both said elliptical cavity and said reflecting means to adjust the energy profile throughout the length of said heating zone.

7. An apparatus in accordance with claim 6 wherein said wall of said elliptical cavity is concavely contoured to provide said means to adjust the energy profile throughout the length of said heating zone.

8. An apparatus in accordance with claim 6 wherein said conically-configured reflecting means is configured to have a concavely contoured reflecting surface to provide said means to adjust the energy profile throughout the length of said heating zone.

9. An apparatus for providing a heating zone of controlled length and predetermined energy profile throughout said length, comprising in combination
   a. means defining an elliptical cavity of predetermined height, said cavity having a first focal axis and a separate second focal axis extending therethrough, the wall of said cavity being optically reflective;
   b. conically-configured reflecting means positioned within said elliptical cavity such that the longitudinal axis of said reflecting means coincides with said first focal axis of said elliptical cavity;
   c. a source of a beam of radiant energy; and
   d. optical focusing means for focusing said beam of radiant energy longitudinally onto said conically-configured surface of said reflecting means whereby said radiant energy is directed against said wall of said cavity and is thereby reflected to form a heating zone of controlled length and of substantially uniform energy distribution at any one level along said length of said heating zone around said second focal axis of said elliptical cavity.

10. An apparatus in accordance with claim 9 having a plurality of said elliptical cavities, said cavities being overlapped so as to have a common first focal axis and separate second focal axes whereby a plurality of separate heating zones are formed simultaneously.

11. An apparatus in accordance with claim 9 including means associated with either said elliptical cavity, said conically-configured reflecting means, or with both said elliptical cavity and said reflecting means to adjust the energy profile throughout the length of said heating zone.

12. An apparatus for providing a heating zone of controlled length and predetermined energy profile throughout said length, comprising in combination
   a. means defining an elliptical cavity of a length greater than the length of the heating zone to be formed and having first and second focal axes extending therethrough, the wall of said cavity being optically reflective;
   b. conically-configured reflecting means positioned within said elliptical cavity such that the longitudinal axis of said reflecting means coincides with said first focal axis of said elliptical cavity;
   c. a source of a beam of radiant energy; and
   d. optical focusing means for focusing said beam of radiant energy longitudinally onto said conically-configured surface of said reflecting means whereby said radiant energy is directed against said wall of said cavity and is thereby reflected to form a heating zone of controlled length and of substantially uniform energy distribution at any one level along said length of said heating zone around said second focal axis of said elliptical cavity.

13. An apparatus in accordance with claim 12 wherein said conically-configured reflecting means is configured to have a truly conical surface.

14. An apparatus in accordance with claim 12 including means associated with either said elliptical cavity, said conically-configured reflecting means or with both said elliptical cavity and said reflecting means to adjust the energy profile throughout the length of said heating zone.

15. An apparatus in accordance with claim 14 wherein said wall of said elliptical cavity is concavely contoured to decrease the length of said heating zone and to provide said means to adjust the energy profile throughout the length of said heating zone.

16. An apparatus in accordance with claim 14 wherein said conically-configured reflecting means is configured to have a concavely contoured reflecting surface to provide said means to adjust the energy profile throughout the length of said heating zone.

17. An apparatus in accordance with claim 12 wherein said optical focusing means includes means to adjust the cross sectional configuration of said beam of radiant energy prior to its striking said conically-configured reflecting means.

18. An apparatus in accordance with claim 17 wherein said means to adjust the cross sectional configuration of said beam of radiant energy comprises means to impart an annular cross sectional configuration thereto.

19. An apparatus in accordance with claim 12 wherein said optical focusing means includes means to adjust the energy distribution within said beam prior to its striking said conically-configured reflecting means.

20. An apparatus in accordance with claim 12 wherein said source of radiant energy is a laser.

21. An apparatus for processing an elongate body which includes forming a molten zone within said body, comprising in combination
   a. means defining an elliptical cavity of a predetermined height, said cavity having a first focal axis and a separate second focal axis extending therethrough, the wall of said cavity being optically reflective;
   b. conically-configured reflecting means positioned within said elliptical cavity such that the longitudinal axis of said conically-configured reflecting means coincides with said first focal axis of said elliptical cavity;
   c. a source of a beam of radiant energy;
   d. optical focusing means for focusing said beam of radiant energy longitudinally onto said conically-configured surface of said reflecting means whereby said radiant energy is directed against said wall of said cavity and is thereby reflected to form a heating zone of controlled length and of substantially uniform energy distribution at any one level along said height of said heating zone around said second focal axis of said elliptical cavity;
   e. at least one body holding means associated with the two ends of an elongate body for positioning said at least one body within said cavity so that the axis of said body coincides with said second focal axis of said cavity and a portion of said at least one body lies within said heating zone; and
   f. means to effect relative translational motion between said body holding means and said heating zone.

22. An apparatus for processing an elongate body which includes forming a molten zone within said body, comprising in combination
   a. means defining an elliptical cavity of a height greater than the length of the heating zone to be formed and having first and second focal axes extending therethrough, the wall of said cavity being optically reflective;
   b. conically-configured reflecting means positioned within said elliptical cavity such that the longitudinal axis of said conically-configured reflecting means coincides with said first focal axis of said elliptical cavity;
   c. a source of a beam of radiant energy;
   d. optical focusing means for focusing said beam of radiant energy longitudinally onto said conically-configured surface of said reflecting means whereby said radiant energy is directed against said wall of said cavity and is thereby reflected to form a heating zone of controlled length and of substantially uniform energy distribution at any one level along said length of said heating zone around said second focal axis of said elliptical cavity;
   e. body holding means associated with the two ends of an elongate body for positioning said body within said cavity so that its axis coincides with said second focal axis and a portion of said body lies within said heating zone; and
   f. means to effect relative translational motion between said body holding means and said heating zone.

23. An apparatus in accordance with claim 22 including means to impart rotational motion to said body holding means.

24. An apparatus in accordance with claim 22 wherein said source of a beam of radiant energy is a laser.

25. An apparatus in accordance with claim 24 wherein said optical focusing means includes means to adjust the cross sectional configuration of said beam of radiant energy prior to its striking said conically-configured reflecting means.

26. An apparatus in accordance with claim 25 wherein said means to adjust the cross sectional configuration of said beam of radiant energy comprises means to impart an annular cross sectional configuration thereto.

27. An apparatus in accordance with claim 26 wherein said optical focusing means includes means to adjust the energy distribution within said beam prior to its striking said conically-configured reflecting means.

28. A method for forming around the surface of a body a heating zone of radiant energy having a relatively narrow, controllable height, comprising the steps of
   a. providing an elliptical cavity of a predetermined height and having two spaced-apart optical axes;
   b. positioning within said elliptical cavity a conically-configured reflector so that the longitudinal axis of said reflector coincides with one of the optical axes of said elliptical cavity;
   c. directing a beam of radiant energy longitudinally onto said conically-configured surface of said conically-configured reflector whereby said radiant energy is reflected onto the wall of said elliptical cavity and thereby through further reflection is concentrated along the other of said optical axis to form a heating zone of a predetermined length; and
   d. positioning the body, which is to be heated in said heating zone, within said elliptical cavity such that its axis coincides with said other of said optical axes.

29. A method in accordance with claim 28 including the step of effecting relative motion between said body and said heating zone.

30. A method in accordance with claim 28 including the step of imparting rotational motion to said body.

31. A method in accordance with claim 28 including the step of adjusting the energy distribution along the length of said heating zone.

32. A method in accordance with claim 31 wherein said step of adjusting the energy distribution along the length of said heating zone comprises adjusting the energy distribution in said beam prior to its being directed onto said conically-configured reflector.

33. A method in accordance with claim 32 wherein said step of adjusting the energy distribution in said beam comprises forming it to have an annular cross sectional configuration.

34. A method for forming around the surface of each of a plurality of bodies a heating zone of radiant energy having a relatively narrow, controllable height, comprising the steps of
   a. providing a plurality of elliptical cavities of a predetermined height, each of said cavities being so overlapped as to have a common optical axis and a separate conjugate optical axis;
   b. positioning within said elliptical cavities a conically-configured reflector so that the longitudinal axis of said reflector coincides with said common optical axis of said elliptical cavities;
   c. directing a beam of radiant energy longitudinally onto said conically-configured surface of said conically-configured reflector whereby said radiant energy is reflected onto the walls of said elliptical cavities and thereby through further reflection is concentrated along the other of said separate optical axes to form a plurality of heating zones of predetermined length; and
   d. positioning the bodies, which are to be heated in said heating zones, within said elliptical cavities such that their axes coincide with said separate optical axes.

35. A method in accordance with claim 34 including the step of adjusting the energy distribution along the length of said heating zones.

36. A method in accordance with claim 35 wherein said step of adjusting the energy distribution along the length of said heating zones comprises adjusting the energy distribution in said beam prior to its being directed onto said conically-configured reflector.

* * * * *